United States Patent
Doh et al.

(10) Patent No.: US 10,347,500 B1
(45) Date of Patent: Jul. 9, 2019

(54) DEVICE FABRICATION VIA PULSED PLASMA

(71) Applicant: Applied Materials, Inc., Santa Clara, CA (US)

(72) Inventors: Chang Wook Doh, Santa Clara, CA (US); Zhibin Wang, San Jose, CA (US); Byungkook Kong, San Ramon, CA (US); Sang Wook Kim, Palo Alto, CA (US); Sang-Jun Choi, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/996,982

(22) Filed: Jun. 4, 2018

(51) Int. Cl.
  *H01L 21/3065* (2006.01)
  *H01J 37/32* (2006.01)

(52) U.S. Cl.
  CPC .. *H01L 21/30655* (2013.01); *H01J 37/32146* (2013.01); *H01J 2237/334* (2013.01)

(58) Field of Classification Search
  USPC ........................................................ 438/710
  See application file for complete search history.

(56) References Cited

U.S. PATENT DOCUMENTS

| | | | |
|---|---|---|---|
| 9,583,357 B1 | 2/2017 | Long et al. | |
| 9,601,319 B1 | 3/2017 | Bravo et al. | |
| 9,620,376 B2 | 4/2017 | Kamp et al. | |
| 9,761,459 B2 | 9/2017 | Long et al. | |
| 9,852,889 B1 | 12/2017 | Kellogg et al. | |
| 9,881,820 B2 | 1/2018 | Wong et al. | |
| 2014/0057446 A1* | 2/2014 | Yu | H01L 21/3065 438/710 |
| 2017/0018411 A1 | 1/2017 | Sriraman et al. | |
| 2017/0069462 A1 | 3/2017 | Kanarik et al. | |
| 2017/0110335 A1 | 4/2017 | Yang et al. | |
| 2017/0113355 A1 | 4/2017 | Genetti et al. | |
| 2017/0115657 A1 | 4/2017 | Trussell et al. | |
| 2017/0117172 A1 | 4/2017 | Genetti et al. | |
| 2017/0178917 A1 | 6/2017 | Kamp et al. | |
| 2017/0236688 A1 | 8/2017 | Caron et al. | |
| 2017/0236741 A1 | 8/2017 | Angelov et al. | |
| 2017/0236743 A1 | 8/2017 | Severson et al. | |
| 2017/0250056 A1 | 8/2017 | Boswell et al. | |
| 2017/0263478 A1 | 9/2017 | McChesney et al. | |
| 2017/0316935 A1 | 11/2017 | Tan et al. | |
| 2017/0330786 A1 | 11/2017 | Genetti et al. | |
| 2017/0334074 A1 | 11/2017 | Genetti et al. | |
| 2017/0372912 A1 | 12/2017 | Long et al. | |

* cited by examiner

*Primary Examiner* — Roberts P Culbert
(74) *Attorney, Agent, or Firm* — Patterson + Sheridan LLP

(57) ABSTRACT

Systems and methods discussed herein are directed towards processing of substrates, including forming a plurality of features in a target layer on a substrate. The formation of the plurality of features includes a main etch operation that forms the plurality of features to a first depth in the target layer. The main etch operation is followed by a phase shift sync pulsing (PSSP) operation, and these two operations are repeated iteratively to form the features to a predetermined depth. The PSSP operation includes one or more cycles of RF source power and RF bias power, this cycle deposits a protective coating in and on the features and then etches a portion of the protective coating to expose portions of the feature.

20 Claims, 7 Drawing Sheets

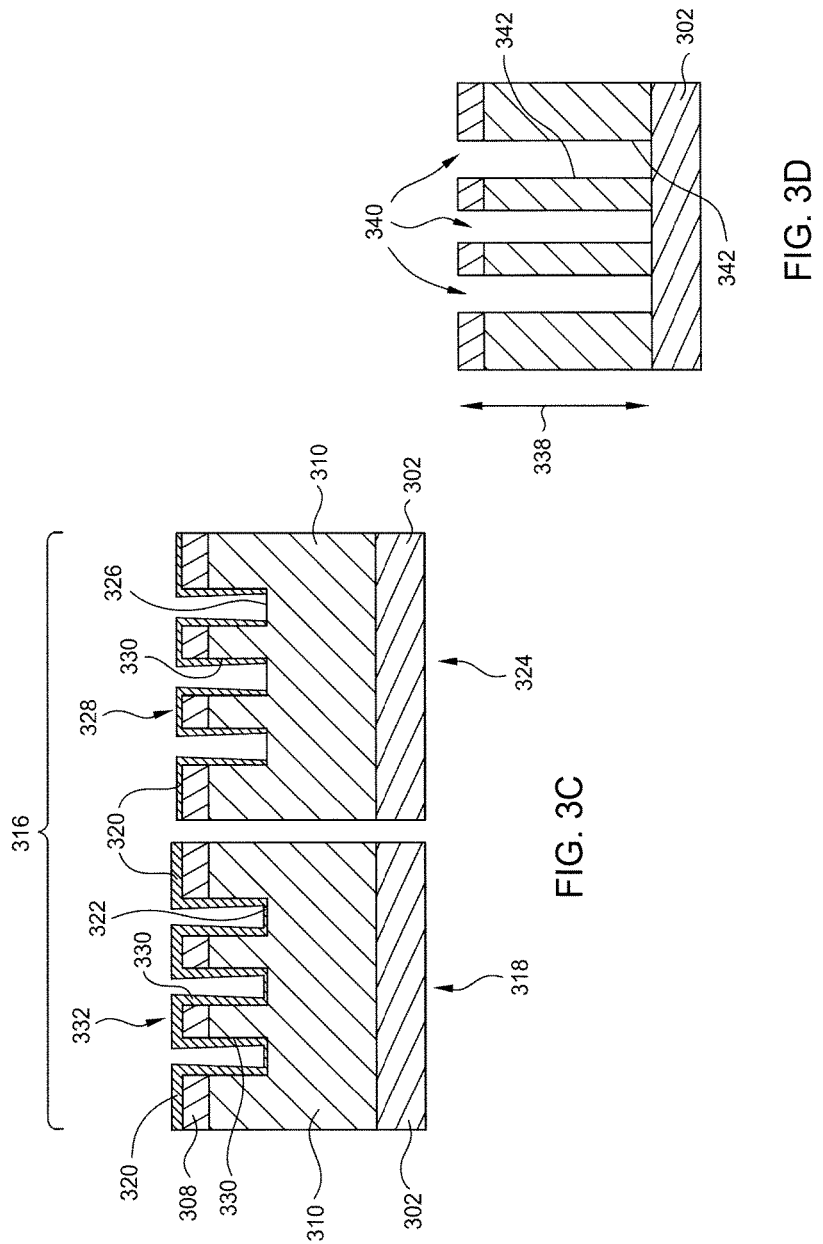

DEVICE FABRICATION VIA PULSED PLASMA

BACKGROUND

Field

Embodiments of the present disclosure generally relate to methods of forming features in a target layer with desired critical dimensions (CD). More specifically, embodiments of the disclosure related to methods of forming features in a target layer with desired critical dimensions (CD) utilizing extreme ultraviolet lithography (EUV) technology.

Description of the Related Art

Integrated circuits have evolved into complex devices that can include millions of transistors, capacitors and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced to the sub-micron scale, it is now necessary to use low resistivity conductive materials (e.g., copper) as well as low dielectric constant insulating materials (dielectric constant less than about 4) to obtain suitable electrical performance from such components.

The demands for greater integrated circuit densities also impose demands on the process sequences used in the manufacture of integrated circuit components. As the geometry limits of the structures used to form semiconductor devices are pushed against technology limits, the need for accurate pattern transfer for the manufacture of structures have small critical dimensions and high aspect ratios has become increasingly difficult. Patterning such small critical dimensions (CD) may be accomplished using extreme ultraviolet (EUV) manufacturing operations.

While utilizing operations such as the extreme ultraviolet (EUV) manufacturing operations, an etching process is often used to transfer features into the target layer formed on a substrate. However, imprecise etch process control may result in CD bias, poor CD uniformity, undesired cross sectional profile, etch CD linearity and unwanted defects. In one etch process, known as dry etching, reactive ion etching, or plasma etching, a plasma is used to enhance a chemical reaction and etch the target layer on the substrate. Undesirably, conventional etch processes often exhibit etch bias due to attack on the photoresist material utilized to pattern the target layer. As the photoresist or sidewall of the film stack is attacked during the etching process, the critical dimension of patterned resist is not accurately transferred to the target layer. Thus, conventional etch processes may not produce acceptable results for forming features having CDs less than about 5 μm. This often results in non-uniformity of CD or mis-matched spacing among the features formed in the target layer. Thus, an etch process having high etch uniformity and substantially equal spacing of the features formed in a target layer to the film stack disposed on the photomask for EUV technology is highly desirable.

Furthermore, in some embodiments, high etching selectivity among each layer disposed in the target layers may also be desired. Poor etching selectivity may result in poor structure integrity, such as non-uniformity of the sidewall profile or a tapered hole profile, which may lead to high scrap costs and/or device failure. Therefore, high selectivity of an etching process is increasingly employed to preserve profiles and thickness of a photoresist layer while etching an underlying materials in the target layers or the like, disposed underneath the photoresist layer.

Thus, there is a need for an improved etch process for forming features in a target layer.

SUMMARY

Embodiments of the present disclosure generally provide for the etching of target layers.

In an embodiment, a method for processing a substrate, comprising: (a) etching a substrate disposed on a substrate support in a processing chamber by supplying an etching gas composition to the processing chamber to form a plurality of features to a first depth in a target layer disposed on the substrate; (b) depositing, subsequent to (a), a protective coating on a sidewall of each of the plurality of features, wherein depositing the protective coating comprises: (1) applying a pulsed RF source power for a first predetermined period of time, and forming, in response to the pulsing, a first layer in between the plurality of features on a top surface of the substrate, on the sidewall of each feature of the plurality of features, and on a bottom of each feature of the plurality of features; and (2) applying a pulsed RF bias power to an electrode disposed in the substrate support for a second predetermined period of time and removing, in response to the pulsing of the RF bias power, a portion of the first layer; and (3) repeating (b)(1) and (b)(2) to form the protective coating; and (c) repeating (a) and (b) until the plurality of features extend to a predetermined depth in the target layer.

In an alternate embodiment, a method for processing a substrate, comprising: (a) etching a substrate disposed on a substrate support in a processing chamber by supplying an etching gas composition to the processing chamber to form a plurality of features in a target layer disposed on the substrate, wherein; (b) depositing, subsequent to (a), a protective coating on a sidewall of each of the plurality of features, wherein depositing the protective coating comprises: (1) applying a pulsed RF source power for a first predetermined period of time, and forming, in response to the pulsing, a first layer in between the plurality of features on a top surface of the substrate, on the sidewall of each feature of the plurality of features, and on a bottom of each feature of the plurality of features; and (2) applying, while the pulsed RF source is off, a pulsed RF bias power to an electrode disposed in the substrate support for a second predetermined period of time and removing, in response to the pulsing of the RF bias power, a portion of the first layer; and (3) repeating (b)(1) and (b)(2) to form the protective coating; and (c) repeating (a) and (b) until the plurality of features extend to a predetermined depth the target layer.

In an alternate embodiment, a method for processing a substrate, comprising: (a) etching a substrate disposed on a substrate support in a processing chamber by supplying an etching gas composition to the processing chamber to form a plurality of features in a target layer disposed on the substrate, wherein a hardmask layer comprising spin-on-carbon is formed on the target layer; (b) depositing, subsequent to (a), a protective coating on a sidewall of each of the plurality of features, wherein depositing the protective coating comprises: (1) applying a pulsed RF source power for a first predetermined period, and forming, in response to the pulsing, a first layer in between the plurality of features on a top surface of the substrate, on the sidewall of each feature of the plurality of features, and on a bottom of each feature of the plurality of features; and (2) applying, during a portion of the first predetermined period while the pulsed RF source power is applied, a pulsed RF bias power to an electrode disposed in the substrate support for a second predetermined period and removing, in response to the pulsing of the RF bias power, a portion of the first layer; and (3) repeating (b)(1) and (b)(2) to form the protective coating; and (c) repeating (a) and (b) until the plurality of features extend through the target layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A-3D are partial schematic illustrations of a substrate during different stages of an etch process according to embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

Figure 1:
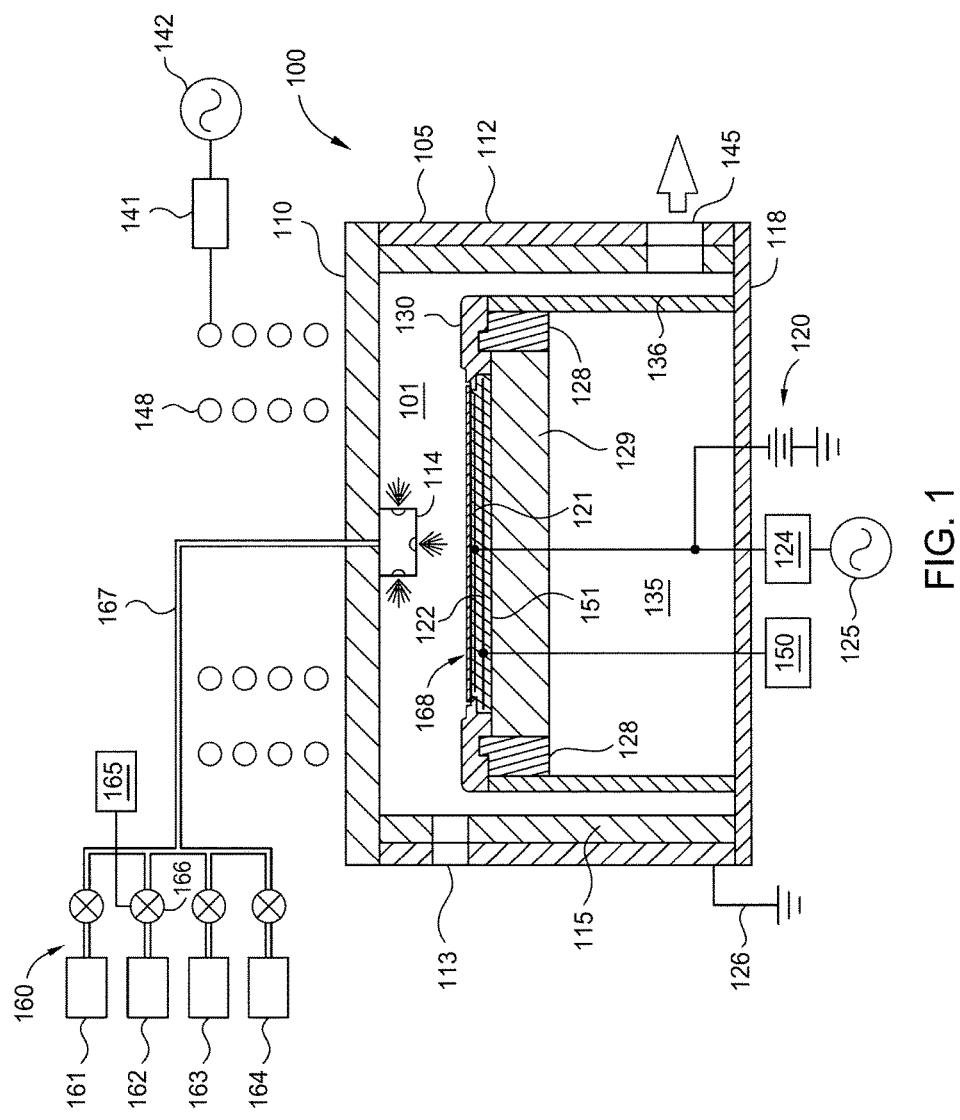
FIG. 1 is a simplified cross-sectional view of an exemplary etching processing chamber for etching a material layer.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure provides methods for manufacturing semiconductor devices. These methods include a material layer etching process comprising one or more etching operations to selectively etch a material layer of a film stack disposed on a substrate to form features in the material layer with a high selectivity to adjacent layers. The material layer may include one or more layers. The material layer etching process utilizes a compensatory layer, referred to herein as a protective coating, to control the critical dimensions (CD) of a feature while the feature is formed in the material layer. In an embodiment, the material layer etching process includes a main etch operation that is repeated in an iterative fashion with a protective coating formation operation to etch a plurality of features in or through a target layer or layers.

In one example, the main etch operation forms a plurality of features in the target layer to a first depth by etching (removing) a first portion of the target layer. Subsequent to the main etch operation, the protective coating formation operation is executed via a phase shift sync pulsing ("PSSP") operation to deposit a protective coating in and/or on the plurality of features. As discussed herein, a "PSSP" operation is a pulsing sequence comprising one or more iterations of a cycle to form the protective coating on and/or in the featured formed by the main etch operation. In particular, the PSSP operation comprises one or more iterations of a cycle of depositing a protective coating in the features formed during the main etch, and, subsequently, partially removing the protective coating by etching (a "dep-etch" cycle). The PSSP operation is thus executed as one or more dep-etch cycles until the protective coating formation operation is complete. The PSSP operation is executed to control the power delivery to a processing chamber to enable control of feature CDs including sidewall profiles and bottom dimensions of features such as trenches and holes. Once the protective coating formation operation is complete, another main etch operation can be executed to increase the depth of the plurality of features without damaging the sidewalls of the features, because the sidewalls are protected by the protective coating formed during the protective coating formation operation. In this manner, the main etch operation and the protective coating formation operation are executed in a plurality of cycles to complete the material layer etching process.

During a dep-etch cycle of a PSSP operation, the protective coating is first deposited into and on top of a plurality of features previously formed by the main etch operation during a protective coating deposition operation and then refined (partially removed) by a protective coating etch operation. The protective coating is deposited during the protective coating etch operation of the dep-etch cycle by using pulsed RF source power. Subsequent to the protective coating deposition operation during the dep-etch cycle, a portion of the protective coating is removed via etching using pulsed RF bias power during the protective coating etch operation. The dep-etch cycle can be repeated for a plurality of iterations to complete the protective coating formation operation before the target layer undergoes another main etch operation. Each subsequent main etch operation increases the depth of the features, and is thus repeated in an iterative fashion with the protective coating formation operation to form the plurality of features to a target depth to complete the material layer etching process. The protective coating deposited during the protective coating formation operation protects the sidewalls and thus preserves CDs including the sidewall profiles of the features while the feature depth is increased during each main etch operation.

As discussed herein, the protective coating formation operation comprises the PSSP operation. During the PSSP operation, one or more dep-etch cycles of depositing a protective coating and partially removing the protective coating can be repeated to form the protective coating on all or part of features formed during the main etch operation. As such, the etching that occurs during the dep-etch cycle of the PSSP operation is an etching of the protective coating deposited during the PSSP operation, in contrast to etching the target layer(s) during the main etch operation. The CDs discussed herein may comprise a plurality of dimensional measurements taken in a lateral direction, e.g., in a direction parallel to a plane of a substrate. The features discussed herein can comprise holes or trenches formed through some or all target layers on a substrate to expose subsequent layers and/or the substrate. The CDs of the plurality of features may comprise a width, diameter, pitch between features, and/or a sidewall geometry. In some embodiments, features may comprise other dimensions including a spacing between adjacent features or arrays of features, a number of features etched per surface area, a flatness of the top surface, or other aspects as appropriate for various applications.

Hardmasks can be employed to help maintain CDs while etching material layers. Hardmasks may be used when deep, e.g., high aspect ratio (AR) features are etched, and the hardmasks may be made out of materials such as carbon or metallic materials that withstand the etchants (etching gases) for a duration associated with forming a plurality of features in a target layer. An aspect ratio may be defined as (depth: width) for a hole, where a width of a hole is less than a depth, and as (width:depth) for a trench, where a width of a trench is greater than its depth. A depth of a hole may be measured perpendicular to a substrate and a width of a hole may be measured parallel to the substrate. During etching of high AR holes where the hardmask is spin-on-carbon (SOC) or another extreme ultraviolet (EUV) mask, multiple challenges may be presented. One challenge during etching is maintaining a consistent SOC profile for access to the material (target) layer since a sufficient contact hole profile is desirable for processing subsequent to etching. A vertical profile of the etched holes (as measured perpendicular to the substrate) may be challenging to obtain solely with carbon passivation species, such as COS or $CH_4$ used in a conventional cyclical etching process, particularly in case of a high AR (e.g., 10:1 or greater) feature. In some embodiments, when an amount of passivation species are used in etching that exceed a predetermined amount, the etch holes may incur clogging, etch stop, or may exhibit an undesirable tapered profile with a larger bottom dimension than a top dimension. Conversely, if an amount of passivation species are used that are under a predetermined amount, an undesirable bowed profile with a bottom dimension under the critical dimensions and a varying diameter may result. The methods discussed herein include a phase shift sync pulsing (PSSP) operation of power that enable improved control of both the sidewall profile and of the bottom CD without clogging or etch stop. In various embodiments, the formation of features in a target layer is performed using a material layer etching process. The material layer etching process includes a main etch operation followed by a protective coating deposition, and the main etch operation and the protective coating formation operation are repeated a plurality of times to form the features to a final depth in or through the target layer. The PSSP operation of the protective coating formation operation may employ an etching species, such as fluorine (F), which is used to partially remove the protective coating. A tunable power ratio is used in various combinations to fabricate a plurality of substrates with improved bottom profiles of the holes, and improved sidewall profiles as well. In an embodiment, a chemistry of the deposition of the protective coating may comprise $SiCl_4$ and $O_2$, which are used to form the $SiO_x$ protective coating. The protective coating formation operation that comprises the PSSP operation follows a main etch operation. During the main etch operation, a first target depth is etched in a material layer, and this main etch operation is followed by the protective coating formation operation comprising a PSSP operation that deposits and shapes a protective coating within the feature(s) formed by the main etch operation. Each PSSP operation comprises at least one dep-etch cycle, such that for each main etch operation that does not reach the endpoint (i.e., final target depth), there is at least one, and in some embodiments a plurality of, dep-etch cycles executed during the PSSP operation to complete the protective coating formation operation.

FIG. 1 is a simplified cross-sectional view of an exemplary etching processing chamber 100 for etching a target layer or layers. The etching processing chamber 100 is suitable for forming and removing one or more film layers from a substrate. One example of the etching processing chamber 100 that may be adapted to benefit from the disclosure is an AdvantEdge™ Mesa™ Etch processing chamber, available from Applied Materials, Inc., located in Santa Clara, Calif. It is contemplated that other process chambers, including those available from other manufactures, may be adapted to practice embodiments of the disclosure.

The etching processing chamber 100 includes a chamber body 105 having a chamber volume 101 defined therein. The chamber body 105 has a sidewall 112 and a bottom 118 which are coupled to a ground 126. The sidewall 112 have a liner 115 to protect the sidewall 112 and extend the time between maintenance cycles of the etching processing chamber 100. The dimensions of the chamber body 105 and related components of the etching processing chamber 100 are not limited and generally are proportionally larger than the size of a substrate 168 to be processed therein within the chamber volume 101. Examples of substrate sizes include 200 mm diameter, 250 mm diameter, 300 mm diameter and 450 mm diameter, among others.

The chamber body 105 supports a chamber lid assembly 110 to enclose the chamber volume 101. The chamber body 105 is fabricated from aluminum, stainless steel, quartz, or other suitable materials. A substrate access port 113 is formed through the sidewall 112 of the chamber body 105, facilitating the transfer of the substrate 168 into and out of the etching processing chamber 100. The substrate access port 113 is coupled to a transfer chamber and/or other chamber of a substrate processing system (not shown).

A pumping port 145 is formed through the sidewall 112 of the chamber body 105 and connected to the chamber volume 101. A pumping device (not shown) is coupled through the pumping port 145 to the chamber volume 101 to evacuate and control the pressure therein within the chamber volume 101. The pumping device includes one or more pumps and/or one or more throttle valves.

A gas panel 160 is coupled by a gas line 167 to the chamber body 105 to supply process gases into the chamber volume 101. The gas panel 160 may include one or more process gas sources 161, 162, 163, 164 and may additionally include inert gases, non-reactive gases, and reactive gases, if desired. Examples of process gases provided by the gas panel 160 include, but are not limited to, hydrocarbon containing gas, such as methane ($CH_4$), $CHF_3$, $CH_2F_2$, $CH_3F$, $C_4F_6$, carbon tetrafluoride ($CF_4$), and $C_4F_8$, halogen containing gas, such as sulfur hexafluoride ($SF_6$), hydrogen bromide (HBr) and chlorine ($Cl_2$), inert gas, such as argon gas (Ar) or helium (He), and other reacting gases, such as nitrogen ($N_2$), and oxygen gas ($O_2$). Additionally, process gasses may include chlorine, fluorine, oxygen and hydrogen containing gases such as $BCl_3$, $C_4F_8$, $C_4F_6$, $CHF_3$, $CH_2F_2$, $CH_3F$, $NF_3$, $CO_2$, $SO_2$, CO, and $H_2$ among others. A plurality of valves 166 control the flow of the process gases from the process gas sources 161, 162, 163, 164 from the gas panel 160 and are managed by a controller 165. The flow of the gases supplied to the chamber body 105 from the gas panel 160 may include combinations of the gases.

The chamber lid assembly 110 includes a nozzle 114. The nozzle 114 has one or more ports for introducing the process gases from the process gas sources 161, 162, 163, 164 of the gas panel 160 into the chamber volume 101. After the process gases are introduced into the etching processing chamber 100, the gases are energized to form plasma. An antenna 148, such as one or more inductor coils, is provided adjacent to the etching processing chamber 100. An RF source power supply 142 is coupled to the antenna 148 through a match circuit 141 to inductively couple energy, such as RF energy, to the process gas to maintain a plasma formed from the process gas in the chamber volume 101 of the etching processing chamber 100. Alternatively, or in addition to the RF source power supply 142, process electrodes positioned below the substrate 168 and/or above the substrate 168 may be used to capacitively couple RF power to the process gases to maintain the plasma within the chamber volume 101. The operation of the RF source power supply 142 is controlled by a controller, such as the controller 165, that also controls the operation of other components in the etching processing chamber 100.

A substrate support assembly 135 is disposed in the chamber volume 101 to support the substrate 168 during processing. The substrate support assembly 135 includes an electrostatic chuck (ESC) 122 for holding the substrate 168 during processing. The electrostatic chuck (ESC) 122 uses electrostatic attraction to hold the substrate 168 to the substrate support assembly 135. The ESC 122 is powered by an RF bias power supply 125 integrated with a match circuit 124. The ESC 122 comprises an electrode 121 embedded within a dielectric body. The RF bias power supply 125 provides a RF bias voltage of about 200 volts to about 3000 volts to the electrode 121. In an embodiment, the RF bias power supply 125 is a DC or pulsed DC source. The RF bias power supply 125 is coupled to the controller 165 for controlling the operation of the electrode 121. In an embodiment, the controller 165 is configured to execute instructions to perform operations discussed herein, including substrate processing such as etching.

A voltage power generator 120 is coupled to the electrode 121 or other electrode within the substrate support assembly 135. The voltage power generator 120 may facilitate supplying a voltage to the electrode 121. The voltage supplied to the electrode 121 establishes an electrical potential that controls profile and plasma distribution across the surface of the substrate support assembly 135. Applying a voltage, either positive or negative, to the substrate support assembly 135 during processing is believed to assist controlling of the distribution or profile of ions, charges, radicals and electrons from the plasma across the surface of the substrate 168 disposed on the substrate support assembly 135. In one embodiment, the voltage power generator 120 may supply a high voltage power, such as greater than 50 Watts, to the electrode 121 during processing. In some embodiments, the ESC 122 optionally includes heaters 151 disposed therein that are connected to a power source 150, for heating the substrate.

A cooling base 129 supporting the ESC 122 includes conduits for circulating a heat transfer fluid to maintain a temperature of the ESC 122 and substrate 168 disposed thereon. The cooling base 129 is provided to assist in controlling the temperature of the substrate 168. The ESC 122 and the cooling base 129 are configured to perform in the temperature range required by the thermal budget of the device being fabricated on the substrate 168. For example, in an embodiment, the ESC 122 and the cooling base 129 are configured to maintain the substrate 168 at a temperature of about minus about 25° C. to about 50° C. for certain embodiments. In one embodiment, the temperature of the substrate 168 is maintained throughout subsequent etch processes at about 70° C. to 90° C. To mitigate process drift and time, the temperature of the substrate 168 is be maintained substantially constant by the cooling base 129 throughout the time the substrate 168 is in the etch chamber.

A cover ring 130 is disposed on the ESC 122 and along the periphery of the substrate support assembly 135. The cover ring 130 is disposed on top of an inner chamber wall 136 and a second insulating ring 128. The cover ring 130 is configured to confine etching gases to a desired portion of the exposed top surface of the substrate 168, while shielding the top surface of the substrate support assembly 135 from the plasma environment inside the etching processing chamber 100. Lift pins (not shown) are selectively moved through the substrate support assembly 135 to lift the substrate 168 above the substrate support assembly 135 to facilitate access to the substrate 168 by a transfer robot (not shown) or other suitable transfer mechanism.

In an embodiment, the controller 165 is utilized to control the process sequence, regulating the gas flows from the gas panel 160 into the etching processing chamber 100 and other process parameters. Software routines, when executed by a CPU of the controller 165, transform the controller 165 into a specific purpose computer (controller) that controls the etching processing chamber 100 such that the processes are performed in accordance with the present disclosure. The software routines may also be stored and/or executed by a second controller (not shown) that is collocated with the etching processing chamber 100. A plurality of programs are stored in a non-transitory memory accessible by the controller 165, these programs are updated on a dynamic basis.

The substrate 168 has various film layers disposed thereon which includes at least one dielectric layer. The various film layers may require etch programs which are unique for the different compositions of the other material layers in the substrate 168. Multilevel interconnects that lie at the heart of the VLSI and ULSI technology employs the fabrication of high aspect ratio features, such as vias and other interconnects. Constructing the multilevel interconnects may require one or more etch programs to form patterns in the various film layers. In one embodiment, the etching processing chamber 100 is configured to at least etch a metal layer to form an interconnection structure, and in another embodiment, the etching processing chamber 100 is configured to etch a plurality of alternating Si-based layers to expose a substrate. The process parameters, such as flow and power, are scaled proportionally with the change in the chamber volume, substrates plan area, substrates range in diameter from 200 mm to 450 mm or greater.

FIG. 1 thus illustrates an exemplary configuration of a type of plasma reactor that can be used to practice the disclosure. For example, different types of RF source power supply and RF bias power supply can be coupled into the etching processing chamber 100 using different coupling mechanisms. Using both the RF source power supply and the RF bias power supply in synchronized RF source and RF bias pulses that may or may not exhibit overlap allows independent control of a plasma density and a bias voltage of the substrate with respect to the plasma. This allows for the PSSP operation discussed herein. In some applications, the plasma is generated in a different chamber from the etching processing chamber 100 in which the substrate is located, e.g., using a remote plasma source (not shown here), and the plasma is subsequently guided into the etching processing chamber 100 using techniques known in the art.

Figure 2A:
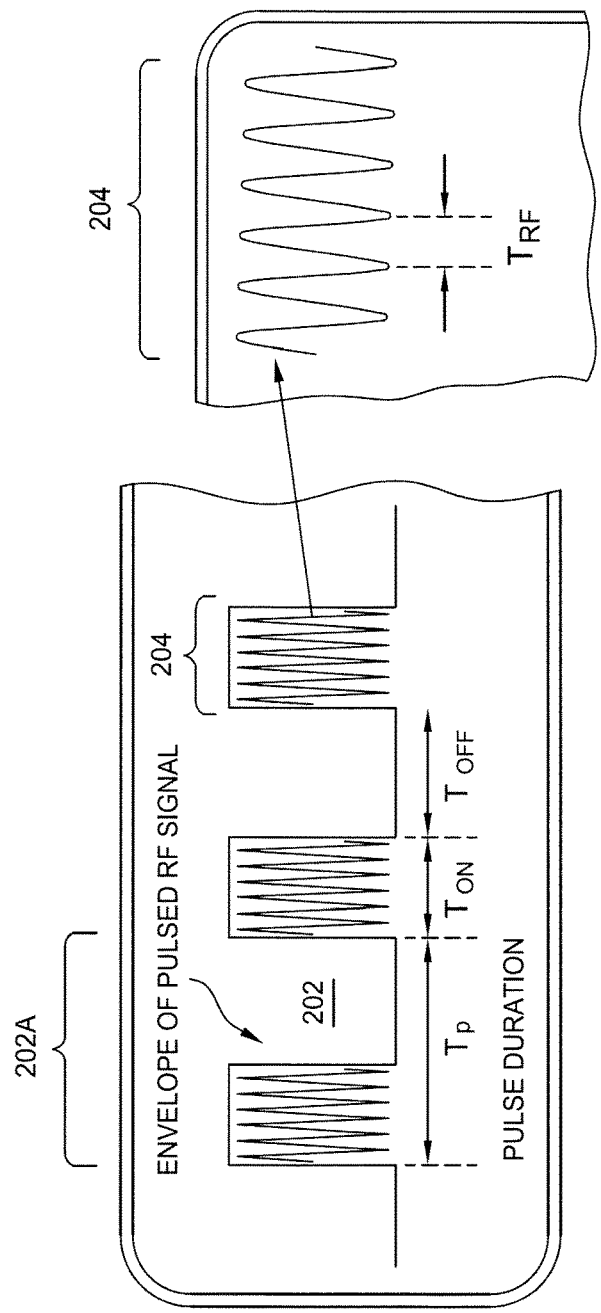
FIG. 2A illustrates a pulsed RF signal according to embodiments of the present disclosure.

FIG. 2A is a schematic illustration of a pulsed RF signal that may be part of a PSSP operation according to embodiments of the present disclosure. The PSSP operation discussed herein is employed during feature formation of features in a target layer to form a protective coating in a plurality of features. During a main etch operation, a feature or a plurality of features are formed in a target layer. Subsequent to this main etch operation, a PSSP operation is employed to deposit a protective coating and subsequently refine the deposited protective coating in one or more iterations of a dep-etch cycle. The protective coating that is deposited and refined during the one or more dep-etch cycles of the PSSP operation protects sidewall CDs during subsequent main etch operations. In particular, FIG. 2A shows an envelope 202 of a pulse 202A of a pulsed RF signal, the envelope 202 identifies an instance of when the pulsed RF signal is pulsed on ($T_{on}$) and off ($T_{off}$). The pulse 202A is an example signal is defined in part by a pulsed signal duration $T_p$. The pulsed signal duration $T_p$ comprises a sum of a pulse-on duration ($T_{on}$) and a pulse off duration ($T_{off}$). The pulse 202A is illustrated here as RF source power supply 142. The $T_{on}$ is the total time during which the RF source power supply 142 provides power to the antenna 148. The pulse off duration $T_{off}$ is the time when the RF source power is turned off, and not supplying power to the antenna 148. The $T_{on}$ and $T_{off}$ can be similarly calculated for pulses caused by the application of RF bias power from the RF bias power supply 125 to the electrode 121.

In an embodiment, a pulsed signal frequency $T_f$ is defined as ($1/T_p$). A pulse duty cycle (D) as used herein is defined as a percentage of an interval, in this case the portion the pulsed signal duration $T_p$ when power is supplied to the etching processing chamber 100 by either the RF source power supply 142 or the RF bias power supply 125, including when both are pulsed in an overlapping or partially overlapping fashion such that RF pulses are applied to the antenna and to the electrode 121 during overlapping time periods. The duty cycle is defined herein as a percentage of the $T_p$ and may be calculated as D=($T_{on}/T_p$)100. The envelope 202 encompasses, during the $T_{on}$ period, a plurality of RF pulses 204 which occur during the $T_{on}$ period. In one example, the RF pulses 204 are pulses from the source power supply 142. A pulse duration $T_{RF}$, which may be from about 0.10 ms to about 20 ms, may vary depending upon if the pulse is from the RF source power supply 142 that produces the pulse or an RF bias power supply 125 that produces the pulse. In another example, pulsing frequency itself ranges from 100 Hz to 10 kHz for a $T_{RF}$, of 0.1 ms to 100 ms. In another example, a PSSP frequency is around 1 kHz to 10 kHz and a $T_{RF}$, the pulse is from 1 ms to 0.1 ms FIGS. 2B-2E are partial graphs of phase shift sync pulsing (PSSP) operations according to embodiments of the present disclosure. As discussed herein, the use of the PSSP operation in various feature formation methods eliminates top clogging of features by the protective coating and clears protective coating depositions on the bottom of features while maintaining sidewall protective coating deposition integrity. As shown in FIGS. 2B-2E, each of the RF source power and RF bias power are pulsed. The source-on portion ($W_s$) is when the RF source power is on, and is referred to herein as the $W_s$ portion 206, and the bias-on portion ($W_b$) is when the RF bias power is on, and is referred to herein as the $W_b$ portion 208. The RF source power and the RF bias power are pulsed with varying bias ($W_b$) delays. In an embodiment, a controller such as the controller 165 discussed in FIG. 1 is configured to execute instructions that initiate operations including the PSSP operation by transmitting instructions to elements of the etching processing chamber 100, including the RF source power supply 142 and the RF bias power supply 125. Thus, the $W_s$ portion 206 of a PSSP operation is executed, based on the instructions from the controller 165, via power from the RF source power supply 142, and the $W_b$ portion 208 is executed, based on the instructions from the controller 165, via power from the RF bias power supply 125. The RF pulses 204 in FIG. 2A can thus occur when the RF source power supply 142 is on during the $W_s$ portion 206 of the PSSP operation. RF bias pulses during the $W_b$ portion 208 can occur when the RF bias power supply 125 is similarly pulsed.

In these examples, the $W_s$ portion 206 of a dep-etch cycle of a PSSP operation causes a deposition of a protective coating such as an $SiO_x$ protective coating on a substrate. The protective coating is formed on and/or inside of a plurality of features, the plurality of features were formed in the substrate to a first depth by a previous main etch operation as discussed herein. During the subsequent $W_b$ portion 208 of the dep-etch cycle of the PSSP operation, the RF bias power supply 125 applies power to the electrode 121 to remove a portion of the protective coating formed during the $W_s$ portion 206. This removal of a portion of the protective coating during the $W_b$ portion 208 may alleviate top clogging of the features by the protective coating and open a bottom deposition of the protective coating formed in the features during the $W_s$ portion 206. In one example, the bottom opening during the $W_b$ portion 208 may be performed with fluorine gas. The protective coating is formed via the PSSP operation (using one or more dep-etch cycles) so that the etchant supplied to the feature(s) during the next main etch operation acts to increase the depth of the features without damaging the previously formed portions of the features. In an embodiment, the $SiO_x$ protective coating formed during the $W_s$ portion 206 is present on the sidewall of the features but not on a bottom surface of the features during the main etch operation to protect the sidewall of the features during subsequent main etch operations. The dep-etch cycles discussed herein during the PSSP operation are controlled by a ratio of $W_s:W_b$ on-times, where the on-times of the $W_s$ portion 206 and the $W_b$ portion may be measured as a percentage of the duty cycle. In an embodiment, each pulse interval $T_p$ 210, 212, and 214 is between about 0.1 millisecond (ms) and about 1 (ms) at a frequency from 1 kHz to 10 kHz.

Figure 2B:
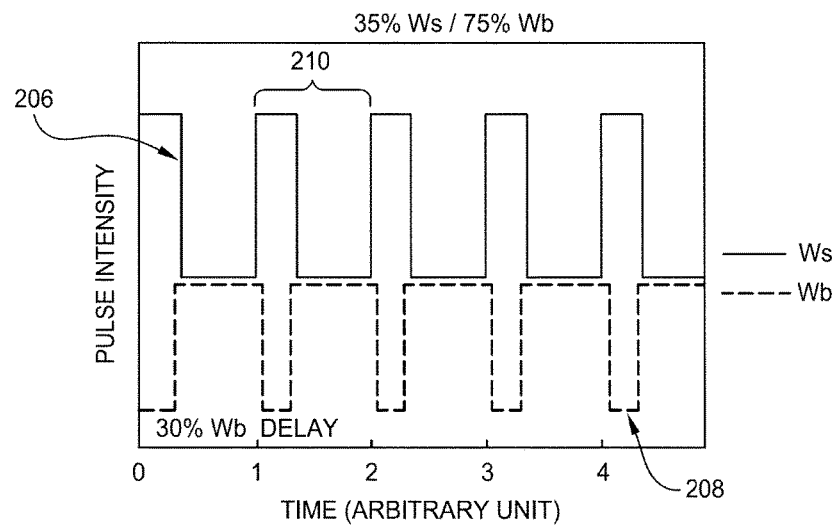
FIGS. 2B-2E are partial graphs of phase shift sync pulsing (PSSP) cycles according to embodiments of the present disclosure.

Each of the $W_b$ portion 208 and the $W_s$ portion 206 occurs for predetermined periods of time, which may be discreet periods of time or overlapping periods of time. As shown in FIG. 2B, there is a 30% $W_b$ delay, the RF source power supply is pulsed about 35% of each duty cycle and the RF bias power is pulsed for about 75% of each duty cycle. In an embodiment, an RF source such as the RF source power supply 142 discussed in FIG. 1 may be employed to generate the source pulses during the $W_s$ portion 206 and the $W_b$ portion 208 is created by the RF bias power supply 125 from FIG. 1. In another embodiment in FIG. 2C, there is a 50% RF bias power delay, the RF source power supply is pulsed during the $W_s$ portion 206 about 55% of each duty cycle, and the bias power supply is pulsed during the $W_b$ portion 208 for about 55% of each duty cycle. In an alternate embodiment as shown in FIG. 2D, there is a 70% RF bias power delay, the RF source power supply is pulsed during the $W_s$ portion 206 about 75% of each duty cycle, and the RF bias power supply is pulsed during the $W_b$ portion 208 for about 35% of each duty cycle. In other embodiments, the RF bias power delay is from about 15% to about 80% of a duty cycle, the RF source power supply is pulsed during the $W_s$ portion 206 for about 10%-90% of the duty cycle, and the RF bias power supply is pulsed during the $W_b$ portion 208 pulsed for about 10%-90% of the duty cycle.

Figure 2C:
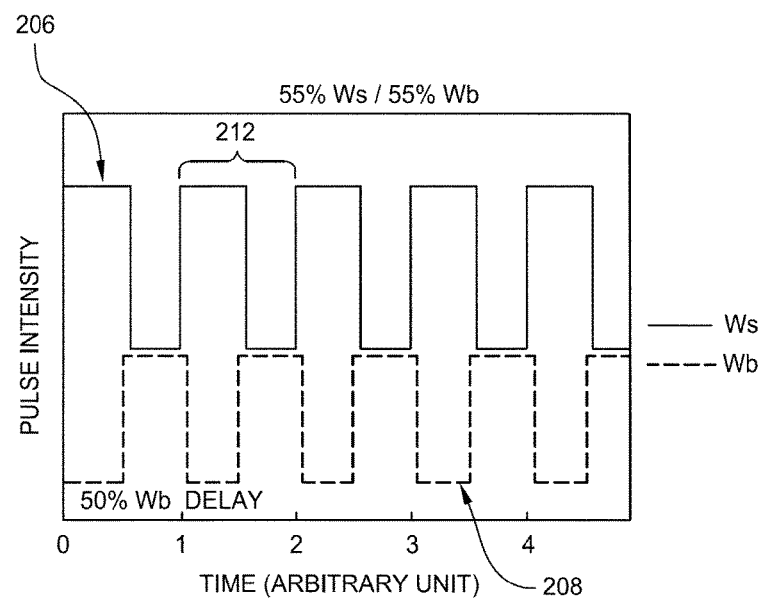
Figure 2D:
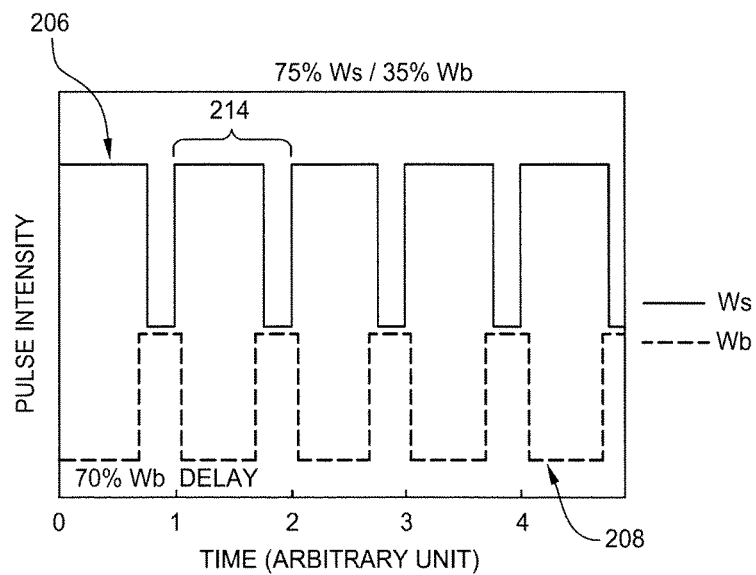
Figure 2E:
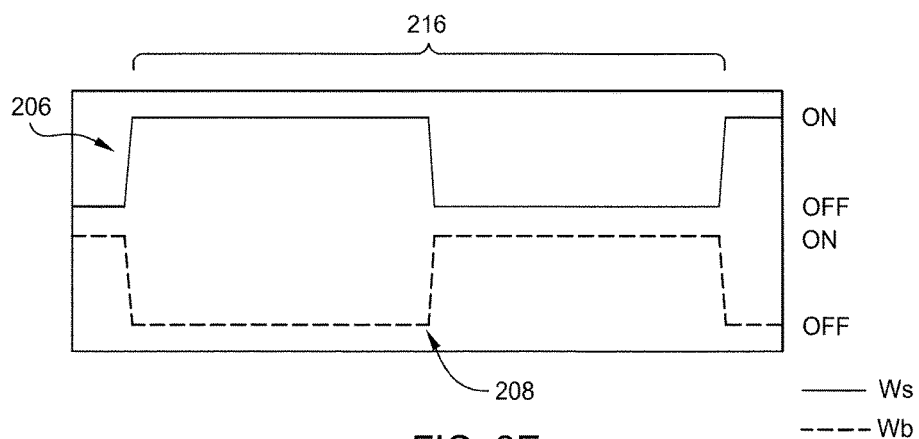
Figure 3A:
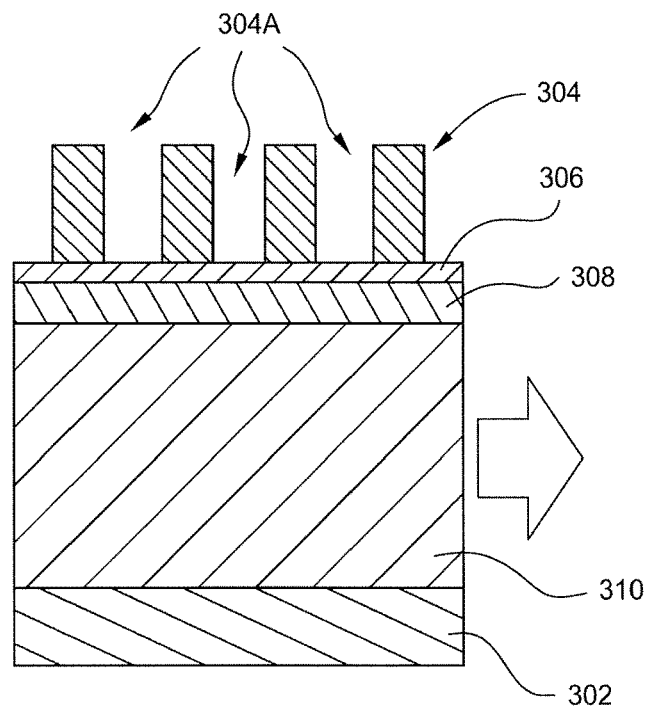
Figure 3B:
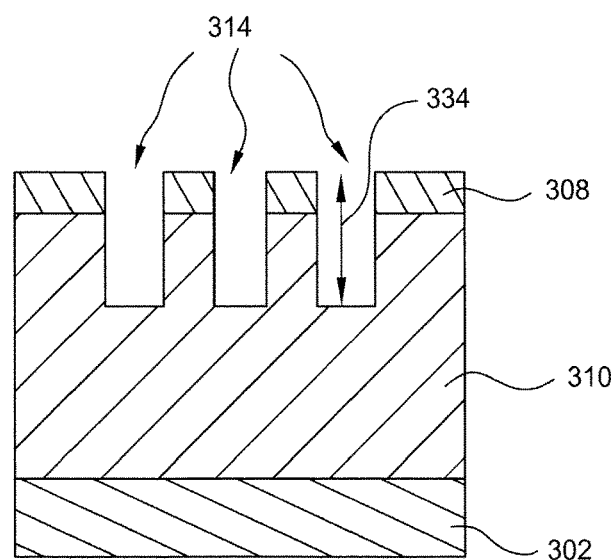

In FIGS. 2B-2D, the RF source power supply and the RF bias power supply are cumulatively pulsed for 110% of the duty cycle, meaning that there is some overlap such that the RF source power supply is turned on while the RF bias power is being applied. In alternate embodiments, as shown in a magnified graph in FIG. 2E, there is no overlap between the on-times of the RF bias power supply and the RF source power supply. In that example, the $W_s/W_b$ on-time for a duty cycle 216 in FIG. 2E is 10%/90%, 20%/80%, 30%/70%, 40%/60%, 50%/50%, 60%/40%, 70%/30%, 80%/20%, 90%/10% or other ranges within those ranges that are in increments of +/−1%, +/−2%, +/−3%, +/−4%, +/−5%, and so on.

Figure 4:
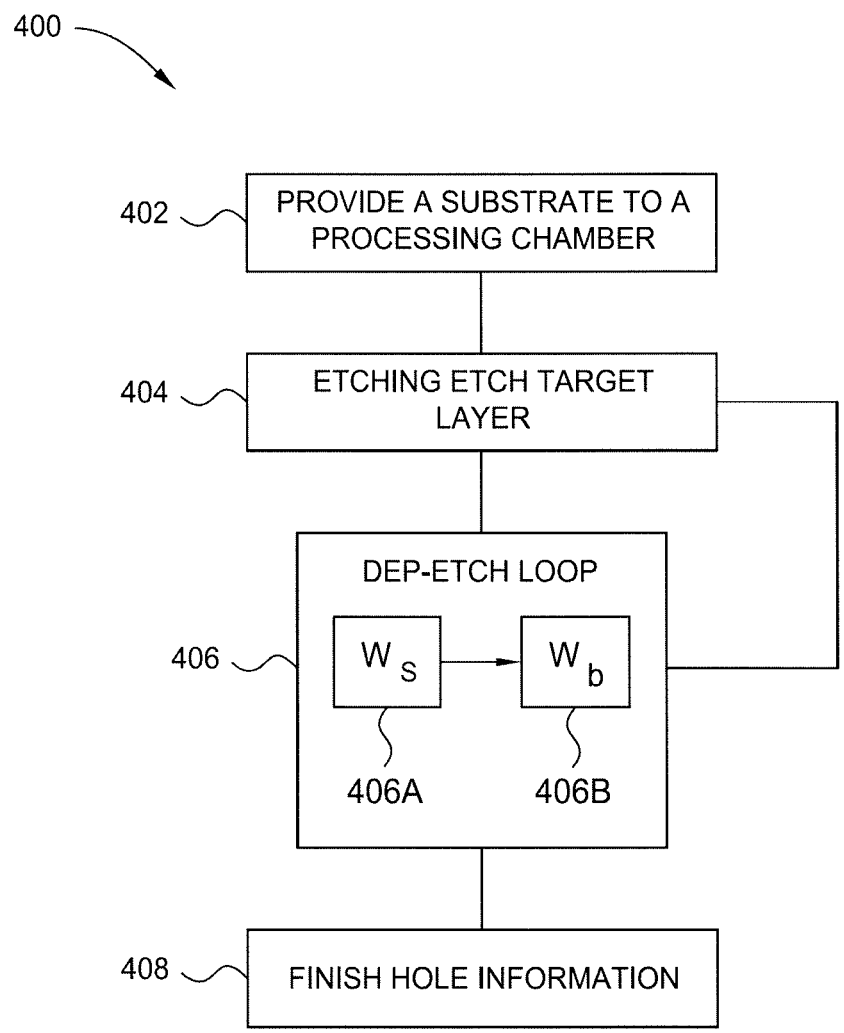
FIG. 4 is a flow diagram of a method for etching a substrate according to embodiments of the present disclosure.

FIGS. 3A-3D are partial schematic illustrations of etching a substrate according to embodiments of the present disclosure. FIG. 4 is a flow diagram of a method 400 of a material layer etching process for etching a substrate according to embodiments of the present disclosure. FIGS. 3A-3D and 4 are discussed together below. In FIG. 4, the method 400 begins at operation 402, which corresponds to the partial cross-section in FIG. 3A. At operation 402, the substrate 302 includes a target layer 310, a barrier layer 308 formed on the target layer 310, and an anti-reflection layer 306 formed on the barrier layer 308. The target layer can comprise silicon-based materials, including silicon oxides and/or silicon nitrides. A hardmask layer 304 is formed on the anti-reflection layer 306. The hardmask layer 304 is patterned to form a plurality of openings 304A during the operation 402.

The hardmask layer 304 is a metallic material or combination of materials which may or may not comprise a dopant, amorphous carbon, doped carbon or amorphous carbon. In some embodiments, the hardmask layer 304 comprises spin-on-carbon (SOC). SOC is a material comprising a high carbon content employed for etching high aspect ratio features (e.g., >15:1 at 20 nm in depth), and SOC comprises a fullerene structure, in contrast to amorphous carbon. In an embodiment, the anti-reflection layer 306 is silicon oxide, silicon nitride, silicon oxynitride, silicon carbide, amorphous carbon, doped amorphous carbon, titanium nitride, and titanium oxynitride.

During a main etch operation 404, the substrate 302 is exposed to one or more etchant gases (illustrated in FIG. 3B) to form a plurality of features 314 through at least part of the target layer 310. The plurality of features 314 are formed at main etch operation 404 in the areas of the openings 304A where the hardmask layer 304 was previously etched. In an embodiment of main etch operation 404, the plurality of features 314 is formed to a first depth 334 through the plurality of openings 304A. In various embodiments, the main etch operation 404 forms the plurality of features 314 to extend the first depth 334, where the first depth 334 as measured from the top 332 of the target layer 310 can be from about 1% to about 99% of the thickness of the target layer 310, as measured perpendicular to the substrate 302. Various gases and combinations of gases are employed at main etch operation 404, including $CF_4$, $CHF_3$, $CH_2F_2$, $CH_3F$, $C_4F_6$, $C_4F_8$, $NF_3$, $SF_6$, $Cl_2$, HF, $Si_2Cl_6$, $SiCl_4$, HBr, HCl, and, in some embodiments, an inert gas or gases such as Ar, He, Ne, Kr, or Xe are used. In various embodiments of etchant gas combinations, the etchant gas combination is introduced into the processing chamber at a flow rate from about 30 sccm to about 300 sccm, and, in some embodiments, individual gases or combinations of gases are introduced into the processing chamber at different rates from about 30 sccm to about 300 sccm during the main etch operation 404.

In an embodiment, the main etch operation 404 employs, in the example of a carbon hardmask etching, $O_2$ at a flow rate of about 200 sccm. In one example, COS gas is introduced during the main etch operation 404 at a flow rate from about 50 sccm to about 70 sccm, and in some embodiments at 60 sccm. In another embodiment, a pressure during the main etch operation 404 is from about 3 mT to 7 mT, 5 mT in some examples, and a temperature of the etching chamber during the main etch operation 404 is from about 3° C. to about 7° C., and may be at about 5° C. The main etch operation 404 has a duration of about 15-30 seconds, and in some embodiments, a duration of 25 seconds.

Subsequent to main etch operation 404, at PSSP operation 406, at least one dep-etch cycle 406A-406B is executed to form a protective coating in the plurality of features 314. The at least one dep-etch cycle 406A-406B comprises a protective coating deposition operation 406A and a protective coating etch operation 406B. During the protective coating deposition operation 406A, a protective coating is formed in the plurality of features 314 formed during the main etch operation 404. Subsequent to forming the protective coating at the protective coating deposition operation 406A, the protective coating etch operation 406B removes a portion of the protective coating formed at the protective coating deposition operation 406A. During the one or more dep-etch cycle(s) 406A-406B of the PSSP operation 406, the RF source power is turned on at the protective coating deposition operation 406A to form the protective coating, and the RF bias power is turned on at protective coating etch operation 406B. The RF source power and the RF bias power are pulsed, for example, in a synchronized, alternating, and in some embodiments overlapping, fashion, during the protective coating deposition operation 406A and the protective coating etch operation 406B to form a protective coating as shown in FIG. 3C below. During the protective coating deposition operation 406A of PSSP operation 406, an RF source power supply applies power to the antenna (as discussed above in FIG. 1 with respect to the RF power source supply 142 and the antenna 148) and the protective coating is deposited in and/or on the features formed by the main etch operation 404. Subsequently, the protective coating formed by the protective coating deposition operation 406A is partially removed by the protective coating etch operation 406B when the RF bias power supply is turned on (as discussed above in FIG. 1 with respect to the RF bias power supply 125).

FIG. 3C shows a dep-etch cycle iteration 316 of a dep-etch cycle 406A-406B of the PSSP operation 406. The dep-etch cycle iteration 316 FIG. 3C shows a protective coating 318, formed during the protective coating deposition operation 406A of the PSSP operation 406. FIG. 3C also shows an etched protective coating 324, that is etched during the protective coating etch operation 406B of the PSSP operation 406. In an embodiment, the protective coating 320 is formed by the protective coating deposition operation 406A along the sidewall 330, on a top portion 332 of the barrier layer 308, and on a bottom surface 322 of each of the features 314. The protective coating 320 comprises an oxide such as $SiO_x$. In an embodiment, a thickness of the protective coating 320 may not be uniform across the sidewall 330 (as measured parallel to the substrate 302), the bottom surface 322 of the features (as measured perpendicular to the substrate 302), or across on a top portion 332 of the barrier layer 308 locations shown in FIG. 3C. The protective coating etch operation 406B refines the protective coating deposition to enable etchant gas access to the features 314 during subsequent main etch operations 404. In examples where a barrier layer 308 is not employed, the protective coating 320 is formed across a top (not shown here) of the target layer 310.

In one example of the dep-etch cycle 406A-406B at PSSP operation 406, a thickness of the protective coating 320 on the bottom surface 322 of the features 314 is less than a thickness of the protective coating 320 on the sidewall 330 of the features 314 and/or top 332 of the target layer 310. During the protective coating deposition operation 406A of the PSSP operation 406, the protective coating 320 formed on the sidewall 330 is formed to comprise a taper such that a thickness of the protective coating 320 near the top 332 of the target layer 310 is thicker than the protective coating 320 coating further down in the features 314 towards the substrate. The resulting trapezoidal profile may not be desirable, in contrast to a desired profile wherein the sidewall 330 of the protective coating 320 is perpendicular to the substrate 302. In an embodiment, the protective coating deposition operation 406A occurs for a first portion (%) of a duty cycle at operation 406, shown as the deposited protective coating 318 in FIG. 3C, during which time an RF source power supply pulses the processing chamber in which the substrate 302 to form the protective coating 320 which can be fabricated as an $SiO_x$ coating.

In an embodiment, during the $W_b$ protective coating etch operation 406B of the PSSP operation 406 as shown in FIG. 3C, the F ion bombardment is directional, e.g., the F ions are directed downward towards the bottom surface 322 of the features 314. During the $W_b$ protective coating etch operation 406B, the protective coating 320 is removed along the bottom surface 322 of the features 314 and is partially removed from the sidewall 330 such that the protective coating 320 remaining after the RF bias power is applied during the protective coating etch operation 406B is perpendicular or substantially perpendicular to the substrate. Each dep-etch cycle 406A-406B at the PSSP operation 406 enables control of one or more processing results, including a CD at the bottom surface 322 of the features 314 as well as profile control of the sidewall 330.

The protective coating etch operation 406B occurs for a second portion (%) of a duty cycle of the dep-etch cycle 406A-406B, shown as the etched protective coating 324 in FIG. 3C, during which time an RF bias pulses a substrate support on which the substrate is disposed or otherwise pulses the substrate to remove part of the protective coating 320 formed during the protective coating deposition operation 406A. During this bias-on ($W_b$) protective coating etch operation 406B, a portion of the protective coating 320 formed as shown in FIG. 3C at the deposited protective coating 318 is removed during the protective coating etch operation 406B. The removal of a portion of the protective coating 320 is shown in FIG. 3C at the etched protective coating 324 occurs by directing a plurality of ions, for example, fluorine (F) ions, perpendicular to the surface of the substrate 302 to remove the protective coating 320 disposed on the bottom surface 322 of the features 314 to expose a bottom etched surface 326, and top 332 of the barrier layer 308 to expose a top surface 328 (or to expose a top surface of the target layer 310 in an embodiment where the barrier layer 308 is not employed). In addition, the application of bias during the protective coating etch operation 406B removes a portion of the sidewall 330.

In an embodiment, at the protective coating deposition operation 406A, a deposition gas composition used for the protective coating deposition operation 406A comprises a mixture of $SiCl_4$ and $O_2$ to form the $SiO_x$ protective coating discussed herein in addition to inert gases and other process gases. In an embodiment, a gas flow rate from 5 sccm to 15 sccm for $SiCl_4$, 10 sccm-20 sccm for $O_2$, 50 sccm-150 sccm for each of HBr and Ar. The protective coating deposition operation 406A occurs at a temperature from about 2° C. to about 7° C. and a pressure from about 2 mT to about 8 mT. In an embodiment, a combination of the protective coating deposition operation 406A and the protective coating etch operation 406B together in a plurality of dep-etch cycles 406A-406B may last from about 5 seconds to about 10 seconds, and, in one example, can have a duration of about 10 seconds. As discussed herein, there may be between 0%-10% overlap between the protective coating deposition operation 406A and the protective coating etch operation 406B. In an embodiment, $CF_4$ is not employed at the protective coating deposition operation 406A.

In an embodiment, during the protective coating etch operation 406B, a gas composition employed comprises a mixture of $SiCl_4$ and $O_2$ to form the $SiO_x$ protective coating discussed herein in addition to inert gases and other process gases such as HBr and Ar. In an embodiment, a gas flow rate from 5 sccm to 15 sccm for $SiCl_4$, 10 sccm-20 sccm for $O_2$, 80 sccm-120 sccm for each of HBr and Ar, and 15 sccm-25 sccm for $CF_4$. The protective coating deposition operation 406A occurs at a temperature from about 0° C. to about 10° C. and a pressure from about 2 mT to 8 mT.

In an embodiment, the dep-etch cycle 406A-406B of the PSSP operation 406 is repeated for a plurality of iterations depending upon factors such as the target aspect ratio, a type of hardmask layer 304, a type of anti-reflection coating layer (ARC) 306, and/or target layer 310 thickness measured perpendicular to the substrate 302. The dep-etch cycles 406A-406B of the PSSP operation 406 can thereby be repeated until a desired thickness of the protective coating 320 is obtained on the sidewall 330, at which point the top 332 and bottom surface 322 do not comprise any remaining portions of the protective coating 320. In some examples, the RF source used at the protective coating deposition operation 406A is on for a period of time that overlaps with the bias applied at the protective coating etch operation 406B. This overlap of the protective coating deposition operation 406A ($W_s$) and the protective coating etch operation 406B ($W_b$) comprises <1%, 5%, 10%, or another percentage of time. The overlap, if any, as well as the bias delay and the percentage of on-time for pulsing each of the source and bias is determined by the hardmask type, hardmask thickness, target layer composition, substrate diameter, substrate thickness, aspect ratio of the feature(s), critical dimensions, end application, and/or other factors.

In an embodiment, during one or more dep-etch cycles 406A-406B at the PSSP operation 406, several process parameters are regulated. In one exemplary embodiment, a process pressure in the processing chamber is regulated between about 10 mTorr and about 5000 mTorr, such as between about 10 mTorr and about 200 mTorr. The RF source (applied at protective coating deposition operation 406A) and the RF bias power (applied at protective coating etch operation 406B) is applied to the processing chamber utilizing synchronized pulses. Pulsing the RF source and bias powers, with or without overlap depending upon the embodiment, assists the trajectory of reactive species to be distributed across the substrate surface, assisting in forming the layer at the protective coating deposition operation 406A and in removing portions of the layer at the protective coating etch operation 406B.

In one example, the RF source power and the RF bias power may be generated at a frequency of about 13 MHz (~13.56 MHz) and are employed to maintain a plasma in the deposition gas composition. In some embodiments, an AC afterglow is generated. For example, a RF source and RF bias power of about 20 Watts to about 200 Watts is applied to maintain plasma inside the processing chamber at each of the protective coating deposition 406A and etch operation 406B. The gas composition used at operation 406, which includes $SiCl_4$, $O_2$, and F or an F-containing gas is flowed into the chamber at a rate between about 200 sccm to about 800 sccm. In some embodiments, during the operations 404-408, a chamber and/or substrate temperature is maintained between about 25° C. to about 300° C., such as between about 50° C. and about 140° C., or in another example between about 50° C. and about 110° C.

In an embodiment, the main etch operation 404 and the PSSP operation 406 are each repeated a plurality of times in an alternating fashion as a part of a cycle shown in FIG. 4. Each time the main etch operation 404 occurs, the dep-etch cycle 406A-406B is subsequently repeated a plurality of times, until the protective coating 320 formation is determined to be complete enough, as discussed below, to return to the main etch operation 404. The main etch operation 404 employs optical emission electroscopy which reads material signatures to distinguish among and between layers to determine when a main etch operation is completed, at which point the PSSP operation 406 is executed. In another embodiment, one or more of a target layer etch rate, a thickness of a target layer being etched, and a target feature depth is calculated and employed to determine timing for the main etch operation 404.

In contrast, since there are polymer gases used in the PSSP operation 406, optical emission electroscopy may not be employed to determine when the PSSP operation 406 is complete (e.g., how many iterations of 406A-406B cycles are performed). Instead, the determination as to when a PSSP operation 406 is complete, that is, when it is time to perform another main etch operation 404, are made based upon properties resulting from a single iteration of the PSSP operation 406. In an embodiment, the cycle of the main etch 404 operation and the PSSP operation 406 is repeated until a plurality of features 340 are formed to meet the CDs at operation 408 as shown at FIG. 3D.

Thus, the PSSP operation 406 is repeated in an alternating, iterative fashion with the main etch operation 404 to complete the method 400, similar to what is shown in FIG. 3D. For example, each dep-etch cycle 406A-406B of a PSSP operation 406 occurs for a period of 0.1 ms to 10 ms. During each iteration of the main etch operation-PSSP operation (404-406) cycle, the features 314 are formed deeper into the target layer 310, the feature depth increasing with each main etch operation 404 while the sidewall 330 profile is preserved by the protective coating formed in the PSSP operation 406.

In the example in FIG. 3D, after the plurality of cycles of the main etch operation-PSSP operation (404-406), the plurality of features 314 discussed in the figures above are etched to a final depth 338 to create a plurality of final features 340. The plurality of final features 340 are formed upon completion of the material layer etching process method 400 to the final depth 338 that is greater than the first depth 334 of the plurality of features 314 formed after a first cycle of the main etch operation 404 and the PSSP operation 404-406. Thus, in various embodiments, the plurality of features formed using the method 400 are formed by expanding (deepened and/or widened) one or more dimensions of the features with each cycle of main etch operation 404 and PSSP operation 406. As shown in FIG. 3D, in an embodiment, one CD comprises the sidewall 342 being configured as substantially perpendicular to the substrate 302. Further in FIG. 3D, the protective coating 320 shown in FIG. 3C has been completely removed from the plurality of final features 340.

While the foregoing is directed to embodiments of the present disclosure, other and further embodiments of the disclosure may be devised without departing from the basic scope thereof, and the scope thereof is determined by the claims that follow.

What is claimed is:

1. A method for processing a substrate, comprising:
   (a) etching a substrate disposed on a substrate support in a processing chamber by supplying an etching gas composition to the processing chamber to form a plurality of features to a first depth in a target layer disposed on the substrate;
   (b) depositing, subsequent to (a), a protective coating on a sidewall of each of the plurality of features, wherein depositing the protective coating comprises:
      (1) applying a pulsed RF source power for a first predetermined period of time, and forming, in response to the pulsing, a first layer in between the plurality of features on a top surface of the substrate, on the sidewall of each feature of the plurality of features, and on a bottom of each feature of the plurality of features; and
      (2) applying a pulsed RF bias power to an electrode disposed in the substrate support for a second predetermined period of time and removing, in response to the pulsing of the RF bias power, a portion of the first layer; and
      (3) repeating (b)(1) and (b)(2) to form the protective coating; and
   (c) repeating (a) and (b) until the plurality of features extend to a predetermined depth in the target layer.

2. The method of claim 1, further comprising:
   forming a hardmask layer on the target layer, wherein the hardmask layer is a spin-on-carbon layer.

3. The method of claim 1, wherein the first predetermined period of time is less than the second predetermined period of time.

4. The method of claim 1, wherein the first predetermined period is greater than the second predetermined period of time.

5. The method of claim 1, wherein removing a portion of the first layer comprises:
   removing a first portion of the first layer disposed on the sidewall of each feature of the plurality of features; and
   removing a second portion of the first layer disposed on the bottom of each feature of the plurality of features.

6. The method of claim 5, wherein a second portion of the first layer remains on the sidewall subsequent to the removing of the first portion.

7. The method of claim 1, wherein (b)(2) occurs when the RF source power is off.

8. The method of claim 1, wherein (b)(1) occurs when the RF bias power is off.

9. The method of claim 1, wherein a portion of the first predetermined period of time overlaps with the second predetermined period of time.

10. The method of claim 9, wherein the first predetermined period of time overlaps with up to 10% of the second predetermined period of time.

11. A method for processing a substrate, comprising:
   (a) etching a substrate disposed on a substrate support in a processing chamber by supplying an etching gas composition to the processing chamber to form a plurality of features in a target layer disposed on the substrate, wherein;

(b) depositing, subsequent to (a), a protective coating on a sidewall of each of the plurality of features, wherein depositing the protective coating comprises:

(1) applying a pulsed RF source power for a first predetermined period of time, and forming, in response to the pulsing, a first layer in between the plurality of features on a top surface of the substrate, on the sidewall of each feature of the plurality of features, and on a bottom of each feature of the plurality of features; and (2) applying, while the pulsed RF source is off, a pulsed RF bias power to an electrode disposed in the substrate support for a second predetermined period of time and removing, in response to the pulsing of the RF bias power, a portion of the first layer; and (3) repeating (b)(1) and (b)(2) to form the protective coating; and (c) repeating (a) and (b) until the plurality of features extend to a predetermined depth the target layer.

12. The method of claim 1, wherein a portion of (b) occurs in an AC afterglow.

13. The method of claim 11, wherein the etching at (a) further comprises forming a plasma from $SiCl_4$ and $O_2$.

14. The method of claim 13, wherein (b)(2) occurs while F gas is introduced into the processing chamber and a plurality of F ions are directed perpendicularly towards the substrate to remove the portion of the first layer.

15. The method of claim 14, wherein a ratio of $SiCl_4:O_2:F$ is 1:1:1.

16. The method of claim 11, wherein the first predetermined period of time overlaps with up to 10% of the second predetermined period of time.

17. The method of claim 11, wherein the sum of the first predetermined period and the second predetermined period is from 0.1 milliseconds (ms) to 1 ms.

18. The method of claim 11, wherein a hardmask layer is formed on the target layer and comprises a spin-on-carbon layer.

19. A method for processing a substrate, comprising:

(a) etching a substrate disposed on a substrate support in a processing chamber by supplying an etching gas composition to the processing chamber to form a plurality of features in a target layer disposed on the substrate, wherein a hardmask layer comprising spin-on-carbon is formed on the target layer;

(b) depositing, subsequent to (a), a protective coating on a sidewall of each of the plurality of features, wherein depositing the protective coating comprises:

(1) applying a pulsed RF source power for a first predetermined period, and forming, in response to the pulsing, a first layer in between the plurality of features on a top surface of the substrate, on the sidewall of each feature of the plurality of features, and on a bottom of each feature of the plurality of features; and (2) applying, during a portion of the first predetermined period while the pulsed RF source power is applied, a pulsed RF bias power to an electrode disposed in the substrate support for a second predetermined period and removing, in response to the pulsing of the RF bias power, a portion of the first layer; and (3) repeating (b)(1) and (b)(2) to form the protective coating; and (c) repeating (a) and (b) until the plurality of features extend through the target layer.

20. The method of claim 19, wherein the portion when the RF bias power is applied while the RF source power is applied is up to 10% of the first predetermined period.

* * * * *